United States Patent [19]

Lloyd

[11] Patent Number: 4,808,855
[45] Date of Patent: Feb. 28, 1989

[54] DISTRIBUTED PRECHARGE WIRE-OR BUS
[75] Inventor: Stacey G. Lloyd, Aloha, Oreg.
[73] Assignee: Intel Corporation, Santa Clara, Calif.
[21] Appl. No.: 133,324
[22] Filed: Dec. 16, 1987
[51] Int. Cl.$^4$ .............. H03K 3/013; H03K 3/355; H03K 5/05; H03K 17/04
[52] U.S. Cl. ...................... 307/480; 307/471; 307/269; 307/263; 307/289; 365/203
[58] Field of Search .............. 365/203, 104; 307/270, 307/480, 481, 471, 473, 263, 268, 269, 289, 290, 590, 601, 605

[56] References Cited
U.S. PATENT DOCUMENTS

| 4,404,474 | 9/1983 | Dingwall | 307/260 |
| 4,647,797 | 3/1987 | San Wo et al. | 307/268 |
| 4,725,986 | 2/1988 | Houba | 365/203 |
| 4,739,198 | 4/1988 | Marugama | 307/270 |

Primary Examiner—Stanley D. Miller
Assistant Examiner—David R. Bertelson
Attorney, Agent, or Firm—Owen L. Lamb

[57] ABSTRACT

A plurality of bus-coupler circuits (14) are connected to a bus wire (10) at different points (12) along its length. Each bus-coupler circuit (14) includes a conventional bus driver (22) which may, for example, comprise a relatively large transistor, but also a bus precharge circuit (16). The bus precharge circuit (16) in each bus-coupler circuit responds to a control signal (20) to apply a small, precharge pulse to the bus wire (10). The control signal (20) is applied to each of the bus-coupler circuits (22) in synchronism with the data (38) in such a way that electrical precharge pulses are applied to the bus wire (10) substantially simultaneously by each bus coupler at approximately the instant of time of an expected data signal transition. In this way, the bus wire (10) receives a small electrical charge (24) at the various points along its length at which the bus coupler circuits are connected. The bus is thereby precharged in anticipation of a transition. The electrical charge is insufficient to substantially change the voltage level at any given local point on the bus; however, its total effect is to significantly reduce the rise time of a bus transition. The electrical charge is sufficient to precharge the capacitive load formed by the bus wire and the bus driver transistors in the immediate vicinity of the charging point. Since the electrical precharge is injected onto the bus by each bus precharge circuit at a number of points along its length, the entire bus wire receives a charge in anticipation of a data transition at any of the circuits (14) along the bus. Consequently, a single, large busdriver transistor is not required to change the voltage level of the entire bus.

9 Claims, 2 Drawing Sheets

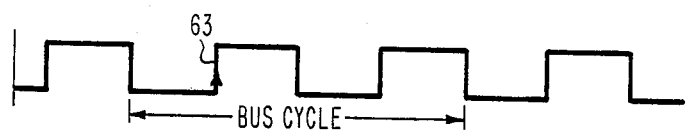
FIG. 6A
FIG. 6B
FIG. 6C
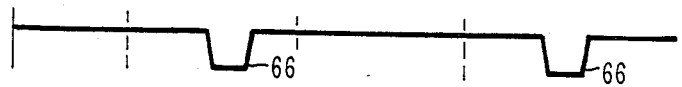
FIG. 6D
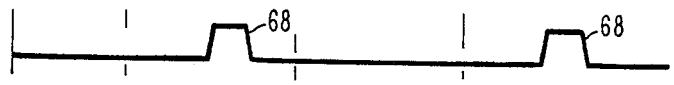
FIG. 6E
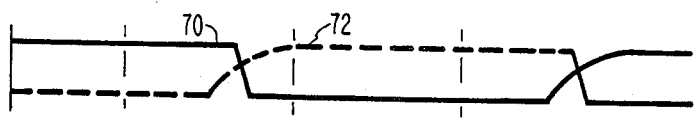
FIG. 6F
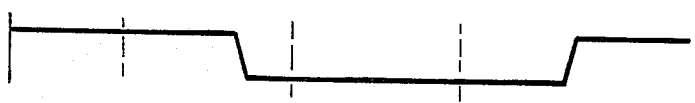
FIG. 6G
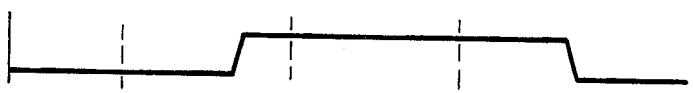
FIG. 7A
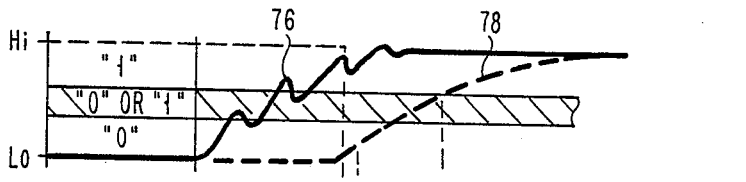
PRIOR ART
FIG. 7B
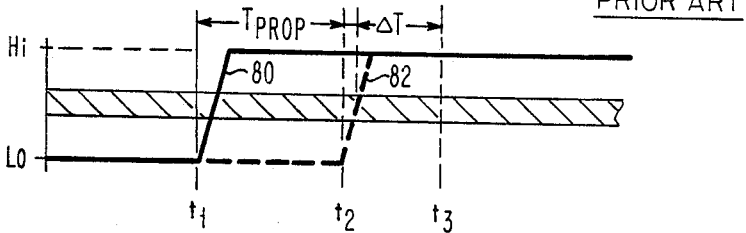

DISTRIBUTED PRECHARGE WIRE-OR BUS

BACKGROUND OF THE INVENTION

This invention relates to integrated logic circuits, and more particularly, to a wire-OR bus circuit having a bus wire and a plurality of bus circuits connected to the bus wire at different points along its length.

BACKGROUND ART

Wire-OR bus circuits are used in digital computers to interconnect the individual computer components such as a central processing unit (CPU), a random access memory (RAM), computer peripheral devices (I/O devices) and the like. Typical bus structures known in the art are the Multi-bus I and Multi-bus II of Intel Corporation, Santa Clara, Calif., and the Future Bus, which has been adopted as a standard by the IEEE (committee 896.1). Bus structures of this type consist of a multiplicity of wires which serve as transmission lines for communicating address, data and control information from one bus-coupled element to another. These transmission lines normally operate between high- and low-voltage states, representing digital ones and zeros. The bus wires are normally biased to reside at their high-voltage states. They are selectively pulled down to their low-voltage states by bus-driver circuits in each coupled element.

More specifically, each of the bus-coupled elements (CPU, RAM, I/O device, etc.) may operate to pull a bus wire down to its lower voltage state from its normal, high-voltage state. The expression wire-OR bus conveys the concept that each wire serves as an OR-gate by changing its state in response to any one of the bus drivers.

Three phenomena combine to limit the speed with which transitions effected at one end of the bus wire may be successfully and reliably detected at the opposite end of the bus wire: (1) transitions from a high state to a low state and vice versa, made by any bus element driver coupled to an individual bus wire, require a finite time period; (2) if a transition is made at one end of the bus wire, a finite time is required for this transition to propagate from that one end to the element connected at the opposite end of the bus wire; and, (3) transitions from one state to the next are normally accompanied by brief, but damped oscillations or ringing on the bus wire.

This limitation in the speed of detection places an upper limit on the bus cycle speed; that is, the clock rate (in MHz) at which the bus is synchronized.

One way used in the past to reduce the transition or rise time to produce a sharp pulse edge, is to decrease the impedance of the bus bias resistors and correspondingly increase the power rating of the bus driver transistors in the bus-coupled elements. This solution is not acceptable if the bus-coupled elements are very large-scale integrated circuits (VLSI circuits). In the case of VLSI circuits, the power dissipation in each circuit chip is a critical factor limiting the number of active and passive devices on the chip so that the size of the bus driver transistors should be kept as small as possible.

A second alternative that has been used in the past to increase the speed is to operate the bus at three voltage levels (thus forming a tristate bus) and to provide relatively large pull-up devices (transistor drivers) as well as pull-down devices as on a two-state bus. Bus transitions occur between a bus low state, maintained and then released by a pull-down device in one circuit element, and a bus high state, effected by a pull-up device in the other circuit element. This tristate mode of operation has the disadvantage that during switching, the pull-up and pull-down devices may both be momentarily conducting current at the same time, providing a low impedance path from the voltage source to ground. For synchronization, the tristate operation also requires a period of twice the progapation time between the circuit elements connected at opposite ends of the bus during a bus transition between the bus low state and the bus high state. In contrast, a wire-OR bus is brought from its low to its high state during a maximum period of only one propagation time from one end of the bus wire to the other. In this type of bus, the full transition from low to high occurs when one pull-down device releases the bus.

It is an object of the present invention to provide a wire-OR bus circuit having an optimized relationship to pulse rise time and power dissipation with reduced oscillations, or ringing, as compared to similar circuits known in the art.

DISCLOSURE OF THE INVENTION

The above object is accomplished in accordance with the invention by providing a plurality of bus-coupler circuits connected to a bus wire at different points along its length. Each bus-coupler circuit includes a conventional bus driver which may, for example, comprise a relatively large transistor, and a bus precharge circuit. The bus precharge circuit in each bus-coupler circuit responds to a control signal to apply a small, local, precharge pulse to the bus wire. The control signal is applied to each of the bus-coupler circuits in synchronism with the data in such a way that electrical precharge pulses are applied to the bus wire substantially simultaneously by each bus coupler at approximately the instant of time of an expected data signal transition.

In this way, the bus wire receives a small electrical charge at the various points along its length at which the bus coupler circuits are connected. The bus is thereby precharged in anticipation of a transition. The electrical precharge is insufficient to substantially change the voltage level at any given local point on the bus; however, its total effect is to significantly reduce the rise time of a bus transition. In particular, the electrical charge is sufficient to precharge the capacitive load formed by the bus wire and the bus driver transistors in the immediate vicinity of the charging point.

Since the electrical precharge is injected onto the bus by each bus precharge circuit at a number of points along its length, the entire bus wire receives a charge in anticipation of a data transition. Consequently, a single, large bus-driver transistor is not required to change the voltage level of the entire bus.

The invention has the advantage of making it possible to reduce the size of the various bus-driver transistors used in the bus circuit and/or to substantially increase the rise time in the low-to-high transitions of the data signal. In addition, because the precharge is injected onto the bus wire at various points along its length, oscillations or ringing, which can result in inductive coupling to adjacent bus lines, is substantially reduced.

The invention also has the advantage that faster rise times make it possible to operate the bus circuit at a higher clock rate.

The invention has the further advantage that it provides a wire-OR bus circuit which operates with a reduced rise time in the digital data signals applied to the bus for the same power dissipation, or with reduced power dissipation for the same rise time as compared to similar circuits known in the art.

BRIEF DESCRIPTION OF THE DRAWINGS

The foregoing and other objects, features, and advantages of the invention will be apparent from the following detailed description of preferred embodiments of the invention as illustrated in the accompanying drawings wherein:

FIG. 6A is a timing diagram showing a system clock signal;

FIG. 6B is a timing diagram showing a bus clock signal;

FIG. 6C is a timing diagram showing a precharge control signal;

FIG. 6D is a timing diagram showing a precharge pulse;

FIG. 6E is a timing diagram showing typical data signals;

FIG. 6F is a timing diagram showing typical bus wire signal levels with the bus circuit according to the present invention;

FIG. 6G is a timing diagram showing typical bus wire signal levels with the bus circuit according to the present invention;

FIG. 7A is a timing diagram showing a typical signal transition on a bus wire with a bus circuit according to the prior art; and, FIG. 7B is a timing diagram showing a typical signal level transition bus wire with the bus circuit according to the present invention.

BEST MODE FOR CARRYING OUT THE INVENTION

Figure 1:
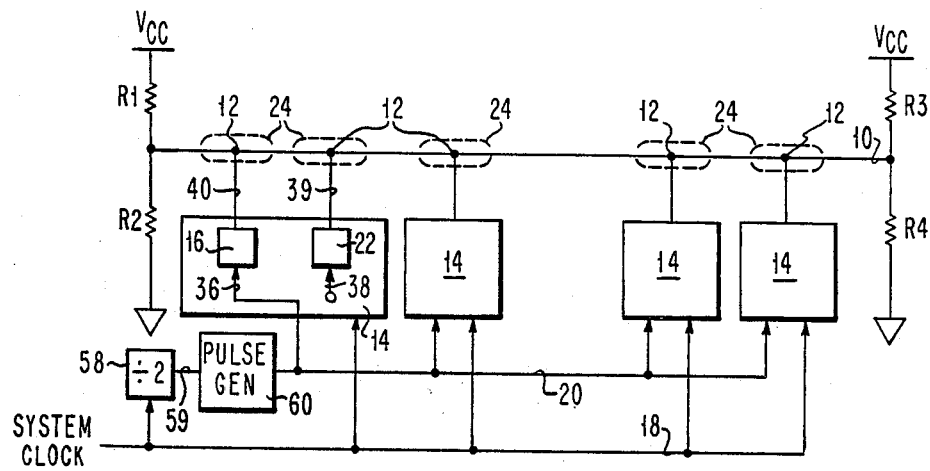
FIG. 1 is a block diagram showing a bus circuit having a plurality of bus-driver and bus-precharge circuits according to the present invention.

FIG. 1 shows a single bus wire (10) connected at a plurality of points (12) to a number of different circuits indicated in block form. Each of the circuit blocks (14) represents a separate circuit element, such as a CPU, RAM, peripheral device, or the like, which is connected to the bus.

It will be understood that in any complex system, such as a digital computer, the bus consists of a plurality of wires for transmitting address, data, and control information from one system circuit element to another. Thus, whereas only a single bus wire (10) is shown in FIG. 1, such a system will include a relatively large number of such bus wires connected in a manner identical to that shown for the bus wire (10).

The bus wire (10) is terminated at one end by resistors R1 and R2 and at the other end by resistors R3 and R4 connected to the voltage supply Vcc and ground. The bus wire (10) is thus biased at a bias-voltage level somewhere between Vcc and ground. Typical values for the resistors are:

R1=R3=120 ohms to 200 ohms.
R2=R4=280 ohms to 460 ohms.

The bus wire (10) operates between high and low voltage levels. The high-voltage level is defined by the bias voltage. The bus wire is pulled down to the low voltage level whenever one of the bus driver circuits (22) in a system-circuit element (14) connects it to ground. Since the bus wire (10) may be pulled low by any one of the system circuit elements (14), it is called a wire-OR bus.

Each of the circuit elements (14) receives both a system clock signal via line 18 and a precharge pulse-control signal via line 20. Normally, the bus is operated at a clock rate that is half the rate of the system clock. If the system clock operates at 32 MHz, for example, the bus clock will operate at 16 MHz. Transitions of the bus wire (10) between high and low levels are initiated one quarter cycle after the beginning and end of each bus cycle, defined by the bus clock (58). The bus wire level is evaluated, or read, by the circuit elements (14) at the end of each bus cycle just prior to any initiation of a transition.

Each system-circuit element (14) includes a bus-driver circuit illustrated in FIG. 1 by the block (22). The bus-driver circuit includes a relatively large transistor connected between the bus wire (10) and ground. When this driver transistor is switched on, the bus (10) is connected to ground and pulled down to its low-voltage level.

According to the invention, each bus driver circuit (22) has associated with it a precharge circuit (16), which dumps a prescribed amount of charge onto the bus at the moment of each expected transition of the bus. The charge applied to the bus is indicated in FIG. 1 by the dashed lines (24). Although the total charge supplied to the bus may be relatively small, it should be sufficient to fill up the capacitance represented by the bus wire itself and all the bus-driver transistor.

Particularly, since the principal capacitance is formed by the driver transistors, a precharge circuit is associated with each one of these transistors. Its proximity to the large capacitance of the driver transistor minimizes the time required to load this capacitance with charge.

Figure 2:
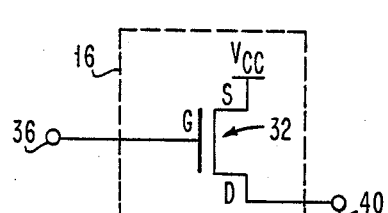
FIG. 2 is a schematic diagram of a bus-precharge circuit according to the present invention.

The precharge circuits (16) may consist of a small N-channel FET (32) connected in the manner shown in FIG. 2. This transistor (32) receives a precharge pulse (20) from the pulse generator (60) via its gate input (36) and supplies this pulse via its output (40) to bus wire (10). If the bus wire is at its high level, no additional electric charge will be supplied to the bus; however, if the bus is at its low level, the bus will be briefly connected to the supply voltage Vcc so that a small amount of charge will be injected into the bus wire capacitance.

As noted above, a precharge circuit is preferably combined with every one of the bus-driver circuits indicated within one of the circuit elements (14) by the block (22). Typical bus driver and precharge circuits in CMOS and bipolar implementation are illustrated in FIGS. 2-3 and 4, respectively.

Figure 3:
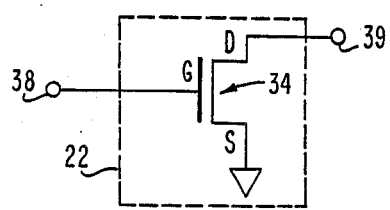
FIG. 3 is a schematic diagram of a bus driver circuit according to a first preferred embodiment of the present invention.

FIGS. 2 and 3 show a two CMOS transistor implementation in which source and drain terminals may be connected in series. In FIG. 2, an N-channel transistor

(32) serves as the precharge circuit and in FIG. 3, an N-channel transistor (34) serves as the bus driver circuit. The precharge-control input and the data-signal input are received at terminals1s 36 and 38, respectively. A series circuit may be formed by the transistors connecting the outputs (39, 40) together. The letters G, S, and D denote the gate, source, and drain terminals of the transistors, respectively.

Figure 4:
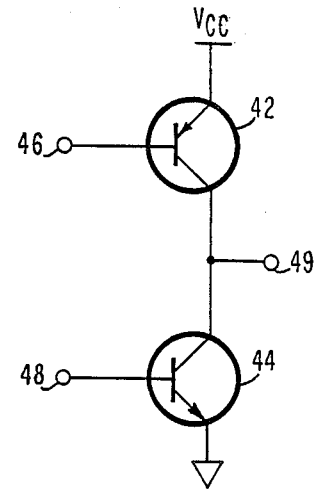
FIG. 4 is a schematic diagram of a bus-precharge circuit and an associated bus-driver circuit according to a second preferred embodiment of the present invention.

A bipolar transistor implementation is shown in FIGURE 4. The precharge transistor (42) is a PNP transistor, whereas the bus driver transistor (44) is an NPN transistor. The precharge control input and bus driver control input are designated with the reference numerals 46 and 48, respectively, and the common output is designated with the reference numeral 49.

There is a substantial difference in size between the precharge transistors (32, 42) and the bus driver transistors (34, 44). The driver transistor is preferably approximately 25 times larger in physical size than the precharge transistor so that it may deliver about 40 times the amount of current. By way of example and not limitation, the respective sizes of the bus driver and precharge transistors in the CMOS configuration may be as follows:

Precharge transistor: 100/4.0
Driver transistor: 2500/2.25

The amount of charge supplied to the bus by each precharge transistor is determined by the width of the precharge pulse. This pulse width is determined by the width of the pulses (20) applied to the precharge transistor inputs (36; 46). One suitable circuit for defining and controlling the precharge pulse width is shown in FIG. 5.

Figure 5:
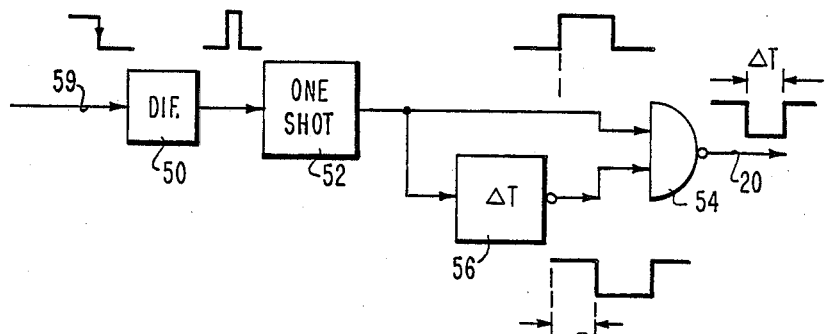
FIG. 5 is a block diagram of a circuit according to a preferred embodiment of the present invention for generating a control pulse.

The circuit of FIG. 5 is responsive to a high-to-low transition in the bus clock signal (59). A differentiating circuit (50) produces a pulse at the instant of this transition and supplies this pulse as a trigger input to a monostable multivibrator or one shot (52). The one-shot (52) produces a pulse of arbitrary width and supplies this pulse to both an AND-gate (54) and a time-delay circuit (56). The time-delay circuit presents this pulse inverted at its output after a time delay (delta T). The time-delay circuit output pulse is passed to the AND-gate (54) which produces a negative output pulse (20) of width delta T in response to coincident, positive input pulses.

The circuit of FIG. 5 may be built into each precharge circuit in each circuit element (14), or it may be provided separately as a common pulse generator (60) for all circuit elements (14).

FIGS. 6A–6G illustrate the timing of the bus circuit according to the present invention. FIG. 6A shows the system clock signal (18) in FIG. 1. FIG. 6B shows the bus clock signal (59), which is exactly one-half the frequency of the system clock (18). Transitions on the bus from low-to-high and from high-to-low are triggered one quarter cycle after the negative-going transition of the bus clock signal, indicated by the arrow (63). The bus voltage is read by the enabled-circuit elements connected thereto, at the instant of each negative clock transition (62), just prior to initiating a bus transition.

FIG. 6C shows the precharge control pulses (66) which are supplied to each of the precharge driver circuits simultaneously. This pulse may be generated, for example, by a circuit of the type shown in FIG. 5.

FIG. 6D shows the precharge pulses (68) which are applied to the bus wire (10) at connection points (12) in response to the control pulses (66). These precharge pulses are produced by the small transistors (32; 42) of the precharge circuits (16).

FIG. 6E shows representative outputs of a pulse driver circuit. The solid line (70) illustrates an output signal which goes from high-to-low when the driver transistor (34, 44) switches on and then returns to high again when the driver transistor (34, 44) turns off. The dashed line illustrates the opposite situation where the output of the bus-driver circuit goes from low-to-high and then returns to low again.

FIGS. 6F and 6G illustrate the combined outputs of the precharge circuit and a bus-driver circuit. FIG. 6F is formed by the addition of the output pulses (68) of the precharge circuit (FIG. 6D) and the output signal (70) of the bus-driver circuit (FIG. 6E) appearing at output terminals (40, 49) of FIGS. 3 and 4, respectively.

FIG. 6G is a signal formed by the combination of the precharge pulses (68) of FIG. 6D and the bus-driver output signal (72) of FIG. 6E. In both the examples shown in FIGS. 6F and 6G, the bus is driven to the desired state (high or low). At the end of the corresponding bus cycle (indicated by the subsequent arrow 62) the bus state is read.

FIGS. 7A and 7B are timing diagrams which show a single low-to-high voltage transition on a bus wire in a bus circuit according to the prior art (FIG. 7A) and a bus circuit incorporating the bus precharge circuit according to the present invention (FIG. 7B). These figures illustrate how a precharge pulse, which is supplied to the bus at different points along its length, reduces the rise time in digital data signals applied to the bus.

As is shown at the left-hand side of FIG. 7A, voltage levels above an intermediate threshold (cross-hatched area) denote a one, whereas voltage levels below this threshold denote a zero. If the voltage on the bus wire is in the range of the intermediate threshold, the one or zero is undetermined.

FIG. 7A shows the voltage (76) applied to the bus by a circuit element of the prior art. At time t1, this voltage rises in a partly exponential, partly oscillatory fashion until it reaches the high-voltage level (Hi) of the bus. At a time t2, which is the propagation delay $T_{prop}$ later, the voltage at the opposite end of the bus follows the signal (76) as indicated by the dashed line (78). Consequently, it is not until time t3 that the voltage level on the bus can be reliably tested.

FIG. 7B illustrates how the rise time is shortened by use of the precharge circuit according to the present invention. Since the electrical precharge on the bus reduces the rise time and eliminates the ringing on the bus, the voltage on the bus quickly jumps from low-to-high as indicated by the solid line (80). After the propagation delay $t_{prop}$, the step in voltage has reached the opposite end of the bus, as indicated by the dashed line (82). Consequently, the voltage on the bus may be reliably read at a time (delta T) prior to the time t3.

While the invention has been particularly shown and described with reference to preferred embodiments thereof, it will be understood by those skilled in the art that the foregoing and other changes in form and detail may be made therein without departing from the scope of the invention.

What is claimed is:

1. For use with a wire-OR bus circuit including a bus wire (10), and a plurality of bus-coupled circuits, connected to said bus wire at different points along its length, a bus-coupled circuit comprising:

a first input (38) for receiving a data signal to be transmitted on said bus wire, said data signal including at least two voltage levels, said signal making transitions between said levels at prescribed times;

a first output (39) coupled to said bus wire (10) at a first point along its length;

signal amplifier means (34), coupling said first input (38) and said first output (39), for amplifying said data signal prior to presentation to said bus wire; and, a bus precharge circuit (16);

said bus precharge circuit having a second input (36) for receiving a control signal (20);

said bus precharge circuit having a second output (40), connected to said bus wire (10) at a second point along its length, for presenting electrical precharge pulses to said bus wire in response to said control signal (20);

said electrical precharge pulses being applied to said bus wire in synchronism with said data signal in such a way that said electrical precharge pulse is applied to said bus wire (10) at approximately the instant of time of an expected data signal transition.

2. The bus circuit defined in claim 1, wherein said second output (40) is connected to said bus wire at a common point with said first output (39).

3. The bus circuit in accordance with claim 1, wherein said said signal amplifier means (22) includes a first amplifying transistor (34) connected to said first output (39).

4. The bus circuit in accordance with claim 3, wherein said bus precharge circuit (16) includes a second amplifying transistor (32) connected to said second output (40).

5. The bus circuit in accordance with claim 4, wherein said first and second transistors (32, 34) each have a current control terminal for applying a current control signal to the transistor, and two current flow terminals for passing current through the transistor; whereby each one of said first transistors is associated with one of said second transistors such that a current flow terminals of said first transistor is connected to a current flow terminal of said second transistor.

6. The bus circuit in accordance with claim 5, wherein said first transistor (34) is connected in series with said second transistor (32) and wherein said first and said second outputs (39, 40) are taken from the series interconnection between the current flow terminals of said first and second transistors.

7. The bus circuit in accordance with claim 1, further comprising means (R1, R2; R3, R4) for biasing each end of said bus wire (10) at a prescribed voltage level.

8. The bus circuit defined in claim 1 further including a pulse-generating means for producing said control signal (20), comprising:

a differentiating circuit (50) responsive to a transition in a bus clock signal (59);

a one shot (52);

said one-shot (52) being capable of producing a first pulse of arbitrary width;

said differentiating circuit (50) producing a second pulse at the instant of said transition in said bus clock signal (59) and supplying said second pulse as a trigger input to said one shot (52);

an AND-gate (54);

a time-delay circuit (56);

said first pulse being supplied to both said AND-gate (54) and said time-delay circuit (56);

said second pulse being delayed at the output of said time-delay circuit by a time delay (delta T) to thereby produce a third pulse;

said first and third pulses being passed to said AND-gate (54) which produces a negative output pulse of width delta T in response to said input first and third pulses.

9. The bus circuit defined in claim 4, wherein there is a substantial difference in size between the said first amplifying transistor (34) and said second amplifying transistor (32), first transistor preferably being approximately 25 times larger in physical size than said second transistor so that said first transistor may deliver about 40 times the amount of current of said second transistor.

* * * * *